United States Patent
Kamarehi et al.

[11] Patent Number: 5,961,851
[45] Date of Patent: Oct. 5, 1999

[54] MICROWAVE PLASMA DISCHARGE DEVICE

[75] Inventors: Mohammad Kamarehi, N. Potomac; Richard Pingree, New Market, both of Md.; Jianou Shi, State College, Pa.; Gerald Cox, Gaithersburg, Md.

[73] Assignee: Fusion Systems Corporation, Rockville, Md.

[21] Appl. No.: 08/626,451

[22] Filed: Apr. 2, 1996

[51] Int. Cl.$^6$ .................................................. H05H 1/00
[52] U.S. Cl. ......................... 216/69; 156/345; 204/298.38
[58] Field of Search ............................ 216/69; 156/345; 204/298.38; 438/726, 727, 728; 118/723 MW, 723 ME, 723 MR, 723 MA

[56] References Cited

U.S. PATENT DOCUMENTS

| | | | |
|---|---|---|---|
| 3,717,448 | 2/1973 | Smith | 118/63 |
| 4,175,235 | 11/1979 | Niwa et al. | |
| 4,507,588 | 3/1985 | Asmussen et al. | |
| 4,513,424 | 4/1985 | Waynant et al. | |
| 4,687,544 | 8/1987 | Bersin | |
| 4,698,822 | 10/1987 | Leprince et al. | |
| 4,780,881 | 10/1988 | Zhang et al. | |
| 4,802,183 | 1/1989 | Harris et al. | |
| 4,866,346 | 9/1989 | Gaudreau et al. | |
| 4,963,713 | 10/1990 | Horiuchi et al. | |
| 4,985,109 | 1/1991 | Otsubo et al. | |
| 4,987,284 | 1/1991 | Fujimura et al. | |
| 5,017,404 | 5/1991 | Paquet et al. | |
| 5,074,985 | 12/1991 | Tamura et al. | 118/723 ME |
| 5,082,542 | 1/1992 | Moslehi et al. | 156/345 |
| 5,134,965 | 8/1992 | Tokuda et al. | |
| 5,262,610 | 11/1993 | Huang et al. | 156/345 |
| 5,302,803 | 4/1994 | Stevens et al. | |
| 5,361,274 | 11/1994 | Simpson et al. | |
| 5,412,684 | 5/1995 | Schlie et al. | 372/82 |
| 5,498,308 | 3/1996 | Kamarehi et al. | 156/345 |
| 5,517,085 | 5/1996 | Engemann et al. | 118/723 MW |

OTHER PUBLICATIONS

Electrodeless high–pressure microwave discharges, Stephan Offemanns, J. Appl. Phys. 67(1), Jan. 1, 1990, pp. 115–123.

Primary Examiner—Thi Dang
Attorney, Agent, or Firm—Pollock, Vande Sande & Amernick, R.L.L.P.

[57] ABSTRACT

A method of removing material from a substrate, and a plasma discharge device wherein a plasma is excited by microwave energy having an electric field which is azimuthally and axially uniform in relation to the plasma tube. The microwave cavity is divided longitudinally into sections by conducting partitions, each of which is separately fed with microwave energy, and the plasma tube extends through openings in the partitions.

11 Claims, 4 Drawing Sheets

MICROWAVE PLASMA DISCHARGE DEVICE

The present invention is directed to an improved method removing material from a substrate, and to an improved plasma discharge device.

In the manufacture of semiconductor devices, it is frequently necessary to remove a substance from a substrate. One example of this is the residue which may remain on a silicon wafer after an etching step is completed. Such residue is frequently composed of a polymeric material which may be present in the form of "veils", and is caused by overetching during etch processes. Another example is the controlled removal of thin film materials such as silicon dioxide or polysilicon from a silicon wafer. The present invention is broadly applicable to processes for removing a substance from a substrate, and for example, would include residue removal, chemical downstream etching (CDE), and etching processes.

It is known to use plasma discharge devices to remove a substance from a substrate, and these may be of the "afterglow" type, wherein it is the afterglow of the plasma rather than the plasma itself which accomplishes removal. While the gas used in the plasma discharge is frequently oxygen, as for ashing applications, it is known to use fluorine containing gases for other applications, for example, where materials such as heavily metallized polymeric residues are to be removed.

In a plasma discharge device, a gas is flowed through a plasma tube which is located in a microwave cavity, and a plasma is excited in the gas by the microwave energy. While the tube is typically made of quartz, when fluorine containing gases are used, it is necessary to make the tube of a fluorine resistant material such as $Al_2O_3$, (alumina), single crystal $Al_2O_3$ (sapphire), $Al_2N_3$, $Z_nO$, $CaF_2$ or $M_gF_2$.

It was found that when a sapphire tube was excited in a system designed for a quartz tube, cracking of the tube occurred. It was discovered that the problem was caused by unequal heating of the sapphire tube due to a non-uniform electric excitation field. Unlike quartz, sapphire is a material which is inclined to crack when heated unequally.

In accordance with the present invention, the problem is solved by providing a resultant microwave excitation electric field which is substantially uniform in the azimuthal and axial directions of the tube. Such a field will cause substantially equal heating of the tube in the azimuthal and longitudinal directions, thus obviating cracking.

The resultant azimuthal and longitudinal uniformity may be provided by modes including the rectangular $TM_{110}$ mode or the cylindrical $TM_{010}$ mode, or possibly by a combination of other modes, the resultant of which is the desired uniformity.

In order to create the conditions necessary to excite and support the rectangular $TM_{110}$ or cylindrical $TM_{010}$ modes, such that it is the dominant driven mode, it is necessary to use a relatively short microwave cavity. This would ordinarily dictate using a correspondingly short plasma tube. However, a problem caused by using a short plasma tube may be that the longitudinal temperature gradient is too great at the ends of the tube where there is a transition from inside the cavity, where there is a field, to outside the cavity where there is no field, thus causing cracking.

To solve this problem, a relatively long microwave structure is provided, which is divided into lengthwise sections by partitions. The plasma tube is fed through a hole in each partition, and thus runs the length of the microwave structure, while each of the lengthwise sections is separately fed with microwave energy. Each section thus appears to the incoming microwave energy to be a separate cavity of relatively short length, thus promoting the formation of the correct mode, while the plasma tube is relatively long, thus obviating any problems with cracking.

The invention will be better understood by referring to the accompanying drawings, wherein.

Figure 1:
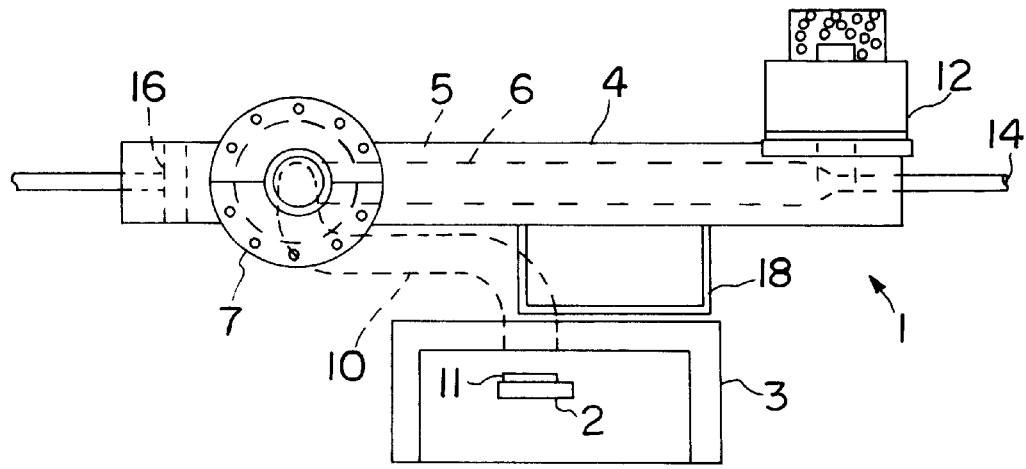
FIG. 1 shows a prior art plasma processing device.

Referring to FIG. 1, a known plasma processing device 1 which uses a quartz plasma tube 6 is depicted. The tube runs through microwave cavity 4, and exits the cavity through microwave seal 7.

When microwave power is provided to the cavity by magnetron 12, a plasma is excited in tube 6. The plasma does not exist on the other side of seal 7, but rather it is the "afterglow" of the plasma which exits from the end of the tube and is used for the processing of work piece 11.

The quartz tube 6 may carry oxygen in which the plasma is excited. As discussed above, when fluorine is required by the process, the quartz tube must be replaced by a tube made of a fluorine resistant material, for example, alumina, or sapphire.

However, when a sapphire plasma tube is operated in a device such as is shown in FIG. 1, cracking of the tube occurs. It was discovered by the inventors that the cracking is caused by the unequal heating of the tube caused by the non-uniform electric field component of the microwave field, which for example, in the device of FIG. 1, is in the $TE_{102}$ mode.

In accordance with the present invention, microwave energy is provided having an electric field which is substantially uniform in the azimuthal and axial directions of the tube. Such an electric field will heat the tube substantially uniformly in the azimuthal and axial directions of the tube, which will prevent or minimize the formation of temperature stresses due to unequal heating. As used herein, the term "azimuthal direction" applies to tubes having both circular and non-circular cross-sections, and means the direction which follows the periphery of the tube in a plane which is perpendicular to the axial direction.

Figure 2:
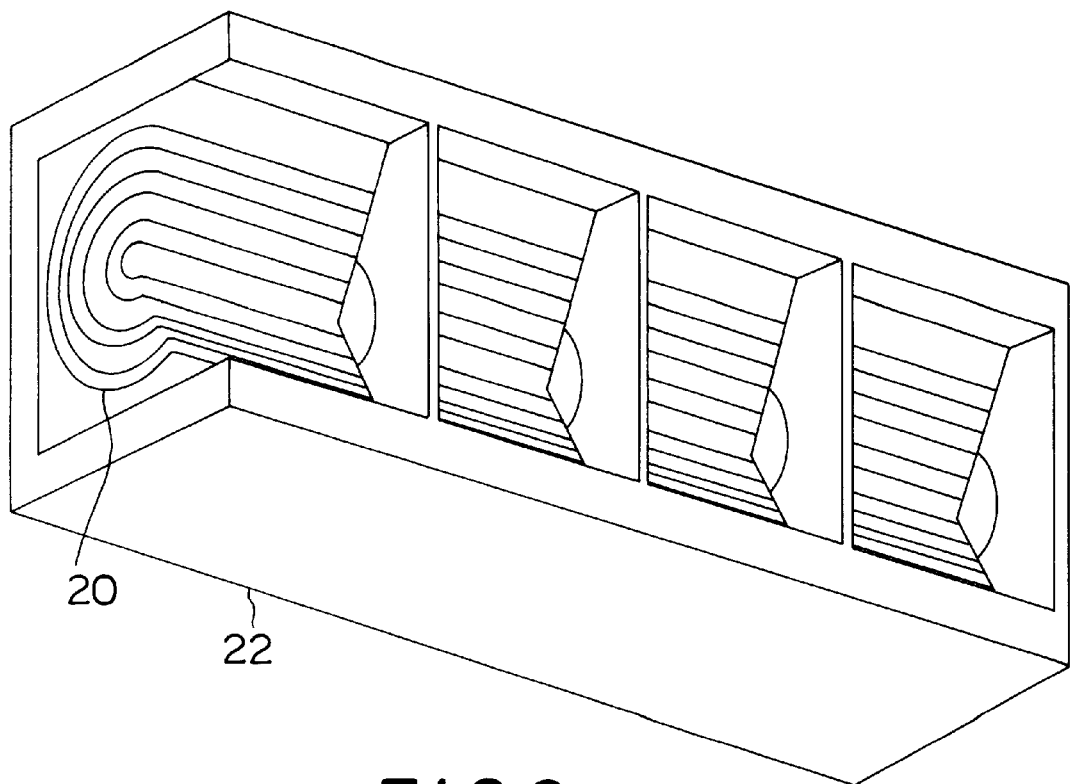
FIG. 2 shows electric field intensity distribution in the rectangular $TM_{110}$ mode, which provides azimuthal and axial uniformity.

The rectangular $TM_{110}$ and circular $TM_{010}$ modes both provide substantial azimuthal and axial uniformity for a tube of circular cross-section. In FIG. 2, the idealized electric field intensity distribution 20 for such modes are depicted (shown in rectangular cavity 22). The intensity distribution may be viewed as concentric cylinders having azimuthal and axial uniformity with the strength increasing towards the center. There is neglible variation in field strength over the relatively small radial dimension of the tube.

A relatively short cavity favors the formation of modes having azimuthal and axial uniformity, which suggests the use of a correspondingly short plasma tube. In a practical system, process etch rates are related to microwave input power. When an input power that attains an acceptable etch rate is used with a short plasma tube, the power density is such that an unacceptably large thermal gradient exists at the ends of the tube, which may cause cracking.

Figure 3:
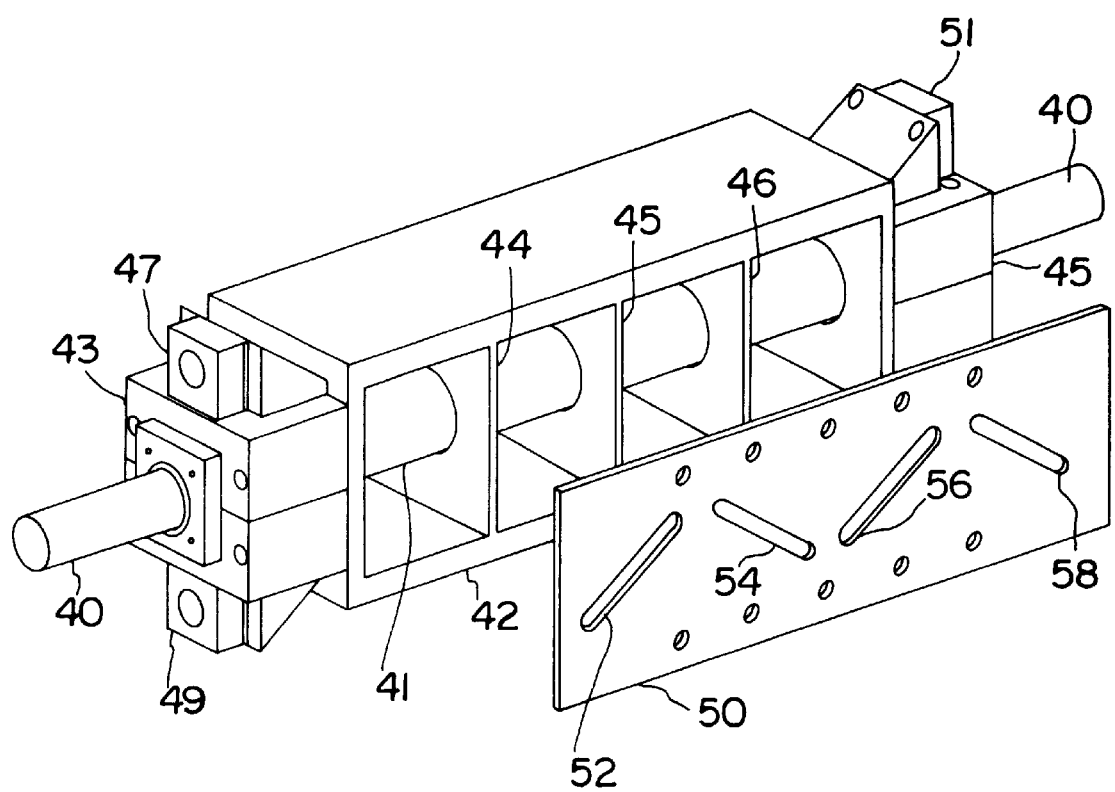
FIG. 3 shows a microwave structure employing the invention.

This problem is solved by using a microwave enclosure which is partitioned into lengthwise sections. Referring to FIG. 3, microwave enclosure 42 is a rectangular box which is partitioned into lengthwise sections by partitions 44, 45, and 46 having plasma tube 40 passing therethrough. While four sections are shown in the embodiment which is illustrated, fewer or more sections may be used. Each partition has an opening through which the plasma tube passes. Each section is separately fed with microwave energy. Thus, each section appears to be a relatively short cavity to the incoming microwave energy, promoting the formation of modes having azimuthal and axial uniformity, and preventing the formation of modes such as the $TE_{101}$, $TE_{102}$, etc., which do not. However, the total length of the plasma tube is relatively long, thus ensuring that the power density in the tube is such that the temperature gradient at the tube ends is within acceptable limits.

Outer tube 41 surrounds the plasma tube inside the cavity. The outer tube is slightly separated from the plasma tube, and air under positive pressure is fed between the two tubes to provide effective cooling of the plasma tube. Tube 41 would typically be made of quartz.

The openings in the partitions 44, 45, and 46 through which the concentric tubes are fed are made larger than the exterior dimension of the plasma tube. There is microwave leakage through such openings which causes a plasma to be excited in the part of the tube that is surrounded by the partition. Such leakage helps reduce thermal gradients in the plasma tube between regions surrounded by partitions and regions that are not. If an outer tube is not used (cooling provided in some other manner), the openings in the partitions are sized so that there is a space between the plasma tube and the partition to provide such microwave leakage. In the embodiment shown in FIG. 3, there is a space between the outer tube and the partition.

FIG. 3 also shows an iris plate 50 which covers the open side of the microwave structure, and is effective to feed microwave energy into the adjacent sections. Plate 50 is a flat metallic plate having irises 52, 54, 56 and 58, through which the microwave energy is fed.

While the invention is applicable to devices where either the plasma or the afterglow from the plasma is used to remove material, the preferred embodiment is an afterglow device. Microwave traps 43 and 45 are provided at the ends to prevent microwave leakage. Such traps may be of the type disclosed in U.S. Pat. No. 5,498,308, which is incorporated herein by reference. Air seals/directional feeders 47 and 49 are provided for admitting cooling air and feeding it to the space between the concentric tubes. Air seal/directional feeder 51 is shown at the outlet end, and a fourth such unit is present, but is not seen.

Figure 4:
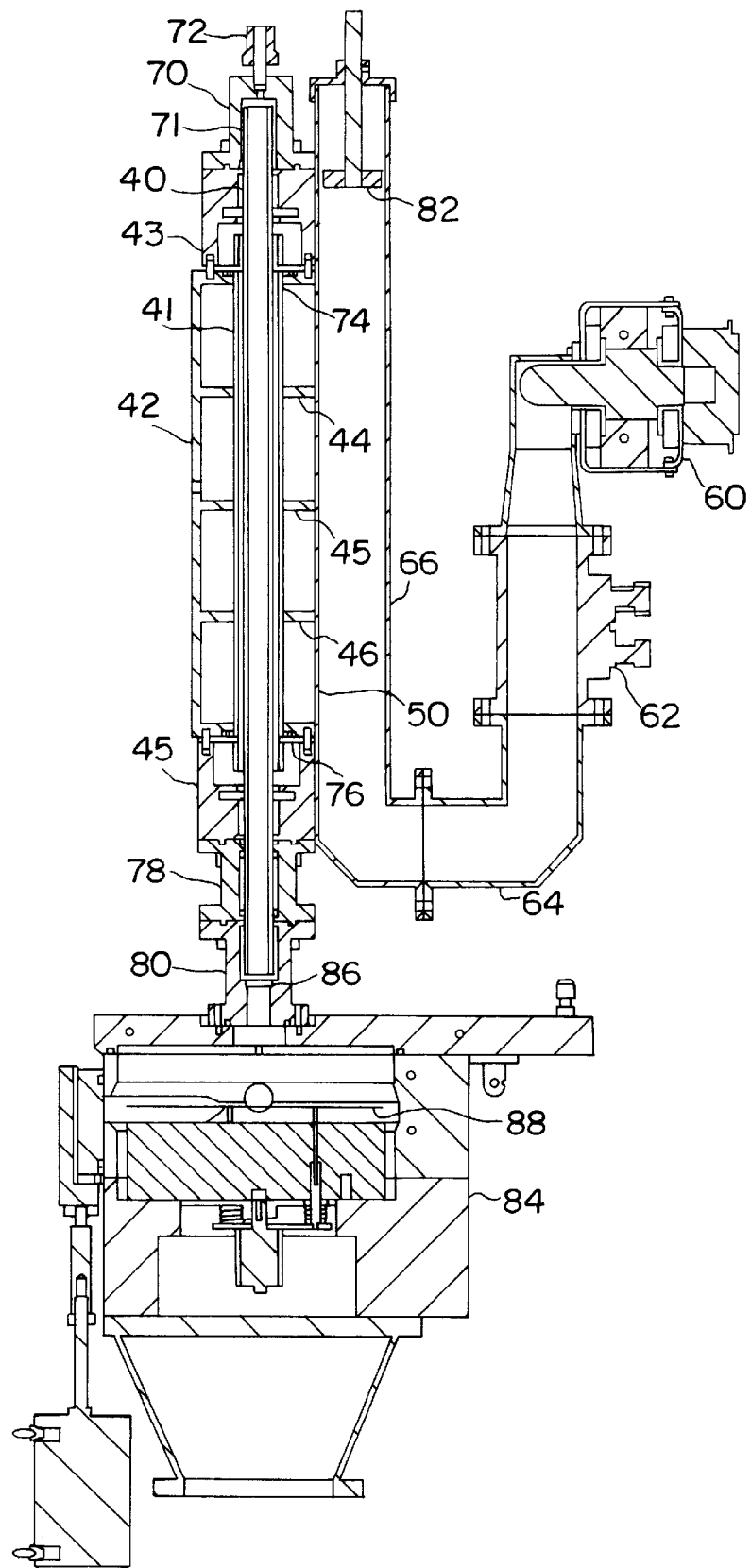
FIGS. 4 and 5 shows a more complete device.

FIG. 4 shows a more complete device as assembled for treating a workpiece. Magnetron 60 provides microwave power, which is fed through coupler 62 to a waveguide supplying a $TE_{10}$ mode, having mutually perpendicular sections 64 and 66. The length of waveguide section 66 is adjustable with moveable plunger 82. The bottom plate of waveguide section 66 in the Figure is iris plate 50, which couples microwave energy into partitioned microwave structure 42, through which the plasma tube extends; thus, a plasma is excited in the gas flowing through the plasma tube.

Referring again to FIG. 4, it is seen that end cap 70 abuts microwave trap 43, and fitting 72 having a central orifice for admitting gas to the plasma tube extends into the end cap. The plasma tube is supported at this end by O ring 71 in the end cap. The outer tube 41 is supported at its ends by abuttment against microwave traps 43 and 45. Spacer 78 is present to provide the proper spacing in relation to the process chamber. The other end of the plasma tube is located in end member 80, and has an orifice 86 for emitting gas into the process chamber.

The process chamber 84 includes retractable wafer support pins 90 and 91, which support wafer 88, to be processed. Chuck 92 is for providing the correct heating to the wafer during processing. One or more baffle plates may be present above the wafer to promote even distribution of the gas.

Figure 5:
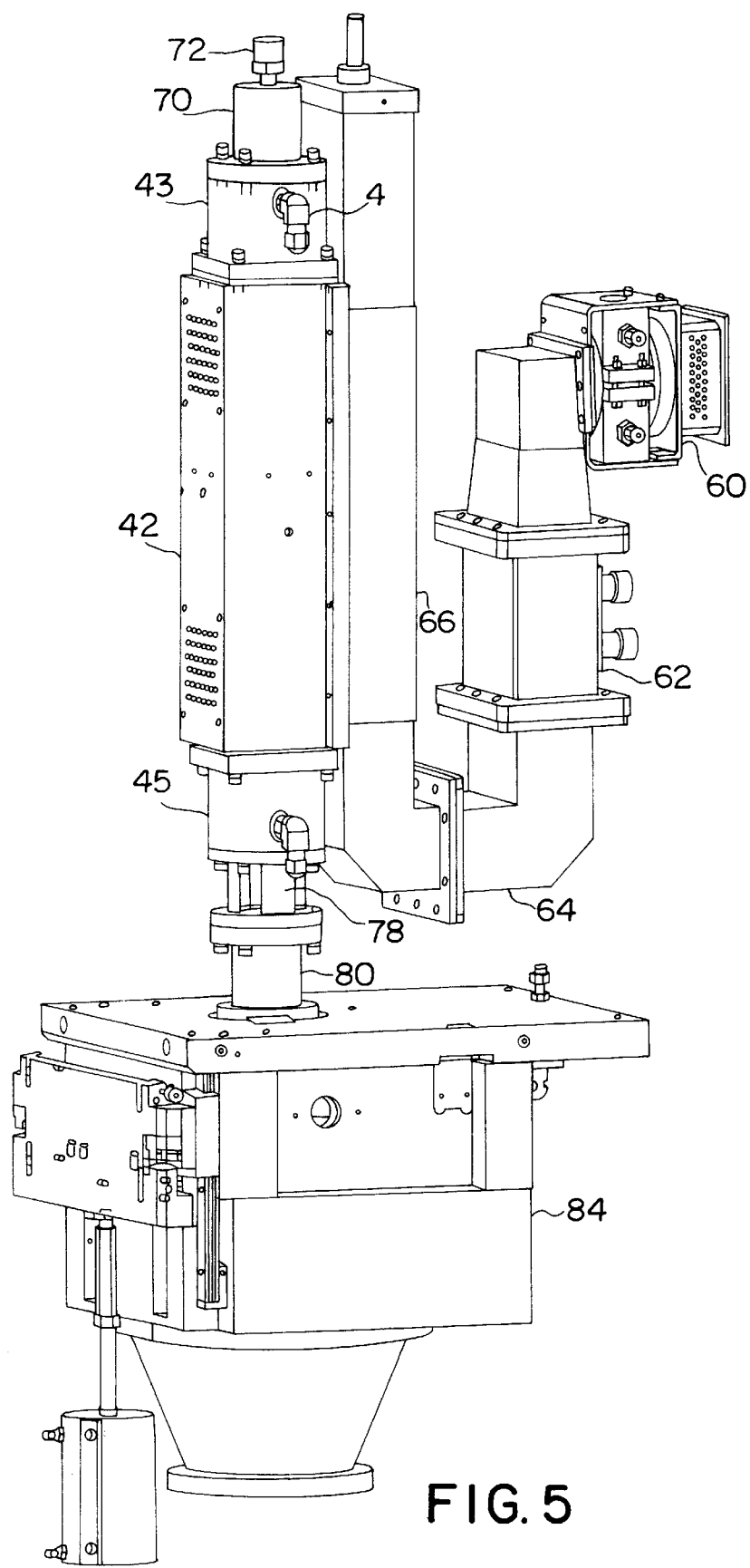

Referring to FIG. 5, an exterior view of the device is shown. The reference numerals in FIG. 5 correspond to those which are in the other Figures.

In the preferred embodiment, microwave enclosure 42 is dimensioned to support the rectangular $TM_{110}$ mode and the enclosure 42 may have a square cross section. The dimensions of the cross sections are such that the $TM_{110}$ mode is resonant. The length of each section is less than $\lambda_g/2$ where $\lambda_g$ is the guide length within the cavity of the $TE_{104}$ mode.

In an actual embodiment which was built, the magnetron frequency was 2443 MHz, the microwave enclosure was 3.475–3.5 inches on each side, and the length of each of four sections was 2.875 inches. A sapphire tube having an ID of about 0.900" and an OD of about 1.000" was used, and a gas of 85% $O_2$, 5% He, 10% $NF_3$ was flowed through the tube for removing residue of polymeric materials in the form of veils which are caused by overetching. The power density was about 36 watts/in$^3$.

As discussed above, the invention finds a particular use with plasma tubes which are made of a material which is inclined to crack when heated unequally. One example of such materials are those having a linear thermal expansion coefficient greater than $7\times10^{-7}/K°$ at operating temperature. However, the invention may also be used with other plasma tubes, for example those made of quartz, as the uniform field will tend to keep the plasma off the tube wall and may provide improved lifetime of the quartz.

A quartz tube may be used with a fluorine containing gas by coating the inside of the tube with a fluorine resistant coating such as $Al_2O_3$, $CaF_2$, fluorosilicade glasses AlN, or other fluorine resistant coating.

An improved method and device for removing a material for a substrate has been disclosed. It should be appreciated that while the invention has been disclosed in connection with illustrative embodiments, variations will occur to those working in the art, and the scope of the invention is defined by the claims appended hereto as well as equivalents.

We claim:

1. A method of removing material from a substrate comprising, providing a plasma discharge device comprised of a microwave cavity having a long dimension, including conducting partitions which divide the cavity lengthwise into sections, each partition having an opening therein, and an elongated plasma tube passing through said microwave cavity and through the opening in each partition in the direction of the long dimension of the cavity, flowing gas through said plasma tube, exciting said gas to a plasma by coupling microwave power to said gas which has an electric field which is substantially azimuthally and axially uniform in relation to said tube, and feeding the afterglow from the plasma to a process chamber where said substrate is located, for removing said material from said substrate.

2. A plasma discharge device for treating a workpiece comprising, a microwave cavity having a long dimension and including conducting partitions which divide the cavity into lengthwise sections, each partition having an opening therein, an elongated plasma tube passing through said microwave cavity and through the opening in each partition in the direction of said long dimension of the cavity, means for providing gas to said plasma tube, means for providing microwave power of predetermined frequency, which is fed to said cavity, said cavity being dimensioned in relation to said microwave frequency to create an electric field in said cavity for exciting said gas in said tube which is substantially azimuthally and axially uniform in relation to said tube, and a process chamber separate from said cavity which is adapted for containing said workpiece and is in fluid communication with said plasma tube.

3. The device of claim 1 further including coupling means for separately coupling the microwave power to each of the cavity sections.

4. The device of claim 3 wherein the electric field in the cavity is in the rectangular $TM_{110}$ or cylindrical $TM_{010}$ mode.

5. The device of claim 3 wherein the plasma tube is made of a material which is inclined to crack when heated unequally.

6. The device of claim 5 wherein said material has a linear thermal expansion coefficient greater than $7 \times 10^{-7}/K°$ at operating temperature.

7. The device of claim 5 wherein the plasma tube is made of sapphire.

8. The device of claim 6 wherein said gas comprises fluorine or a compound thereof.

9. The device of claim 3 wherein the openings in the partitions are made large enough so that the plasma tube is separated from the partition so as to provide microwave leakage.

10. The device of claim 3 wherein said coupling means is a plate with coupling irises therein.

11. The device of claim 3 wherein said tube is coaxial with an outer tube which surrounds said tube, and wherein pressurized cooling gas is fed through the space between said tube and said outer tube.

* * * * *